United States Patent [19]

Reddy

[11] Patent Number: 4,851,609

[45] Date of Patent: Jul. 25, 1989

[54] PROTECTIVE HOUSING FOR AN ELECTRICAL DEVICE

[76] Inventor: Prabhakara Reddy, 302 Mott Rd., Fayetteville, N.Y. 13066

[21] Appl. No.: 192,141

[22] Filed: May 10, 1988

[51] Int. Cl.⁴ .............................................. H05K 9/00
[52] U.S. Cl. .................................. 174/35 R; 174/52.1; 361/424
[58] Field of Search .................. 174/35 R, 35 MS, 51, 174/52.1; 361/424

[56] References Cited

U.S. PATENT DOCUMENTS

| 3,243,760 | 3/1966 | Dupre et al. | 439/579 |
|---|---|---|---|
| 3,989,333 | 11/1976 | Cauldwell | 439/76 |
| 4,025,150 | 5/1977 | Nordberg et al. | 439/218 |
| 4,141,615 | 2/1979 | Takeuchi et al. | 439/135 |
| 4,218,578 | 8/1980 | Olschewski et al. | 174/35 R |
| 4,273,407 | 6/1981 | Snuffer et al. | 439/579 |
| 4,567,317 | 1/1986 | Ehrlich et al. | 174/35 R X |
| 4,734,541 | 3/1988 | Moran, Jr. | 174/35 R |

FOREIGN PATENT DOCUMENTS 3313967 10/1984 Fed. Rep. of Germany .... 174/35 R
3313970 10/1984 Fed. Rep. of Germany .... 174/35 R Primary Examiner—Morris H. Nimmo
Attorney, Agent, or Firm—Wall and Roehrig

[57] ABSTRACT

Apparatus for enclosing an electrical device that includes a two-piece housing having a base section and a cover section. At least one of the sections includes a molded plastic shell made of a high strength, weather resistant plastic and a conductive metal liner that surrounds the electrical device. The other section can be of similar construction or cast of a conductive metal such as aluminum.

10 Claims, 1 Drawing Sheet

PROTECTIVE HOUSING FOR AN ELECTRICAL DEVICE

BACKGROUND OF THE INVENTION

This invention relates to apparatus for protectively housing a wide variety of electrical devices used in either CATV or other communication systems, and in particular, to a shielded housing for enclosing a CATV passive device such as a directional tap or the like.

In community antenna television systems (CATV), communication signals are typically transmitted to subscriber locations by means of coaxial distribution cables. Each cable has a grounded metal sheath that shields a signal carrying center conductor from unwanted interference. A number of passive devices referred to as taps are positioned along the distribution lines which enable one or more drop lines to be connected to the distribution line by which communication signals are diverted to various subscriber locations. These passive devices are generally contained in protective housings that are specifically adapted to electrically shield and physically protect the enclosed circuit elements from radio frequency interference and the surrounding ambient.

Television cable systems may be installed either above ground or below ground. In an above ground installation, protective housings containing these passive devices are suspended between poles upon support wires. The television distribution cable is connected to each housing in a straight through configuration by means of axially aligned access ports provided in the opposing side walls of each housing. This straight through cable arrangement minimizes cable bending and facilitates the routing of the cable along existing telephone line systems Housings used in the in ground installations, on the other hand, are generally mounted upon pedestals. In this arrangement, the distribution cable is run into and out of the housing through parallelly aligned access ports contained in the front wall of the housing As described by Norberg et al. in U.S. Pat. No. 4,025,150 it is common in the industry to provide two sets of access ports in each protective housing so that it can be adapted for use in either an above ground or an in ground installation. Plugs are placed in the unused ports to prevent moisture and dirt from passing into the housing As further disclosed by Norberg et al., both the base and cover sections of the protective housing have heretofore been die cast of aluminum or some other conductive metal. The heavy metal castings provide good electrical shielding for the housed electrical components, however, the castings, because of the nature of the fabrication process, tend to be porous. As a result, moisture is able to penetrate the walls of the housing and attack the enclosed electrical components. In the case of an aluminum casting, the metal deteriorates rapidly when exposed to weather in an outdoor or free environment. The casing generally must be chemically treated and/or painted to render the housing sections weather proof. This, of course, is expensive and considerably increases the unit cost of the housings.

SUMMARY OF THE INVENTION

It is therefore an object of the present invention to improve protective housings used in all types of communication systems in which the system products must be electrically and physically protected.

It is a further object to provide a non-corrosive, non-porous, leak resistant housing for shielding electrical components used in communication systems such as CATV systems.

Another object of the present invention is to reduce material and labor costs involved in the manufacture of housings for protecting passive devices used in cable television systems while still retaining the radio frequency interference integrity and of the system.

Yet another object of the present invention is to enhance the useful life of protective housings used in communication systems.

Another object of the present invention is to provide housing for protectively enclosing CATV passive devices used in communication systems which has a plastic outer shell and a conductive inner liner.

In the main embodiment of the present invention, these and other objects of the invention are attained by means of a two piece housing for connecting one or more drop lines to a television distribution line that includes a base section and a cover section. Both sections are molded from a high-strength, moisture proof plastic or any other suitable non-metallic material which when brought together form an interior chamber capable of housing one or more passive devices of the type used in cable television systems. The two piece housing is lined with a split metallic shield that is adapted to separate with the two sections when the housing is opened. In a second form of the invention one part of the housing is made of cast metal such as aluminum while the other half is formed of a plastic shell and a metal liner that closes against the cast metal section to provide both electrical shielding and weather-tight protection for the enclosed electrical component.

BRIEF DESCRIPTION OF THE DRAWING

For a better understanding of these and other objects of the present invention, reference is made to the following detailed description of the invention which is to be read in conjunction with the following drawings, wherein.

DETAILED DESCRIPTION OF THE INVENTION

Figure 1:
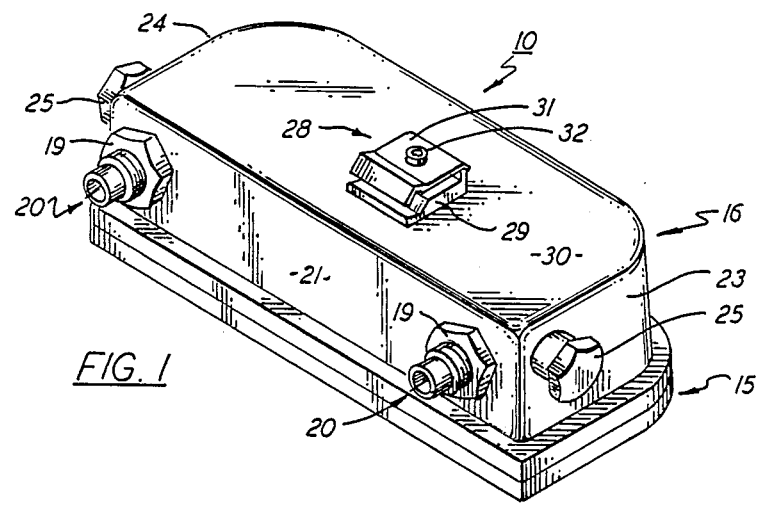
FIG. 1 is a perspective view of a two piece housing for a passive electrical device which embodies the teachings of the present invention.
Figure 2:
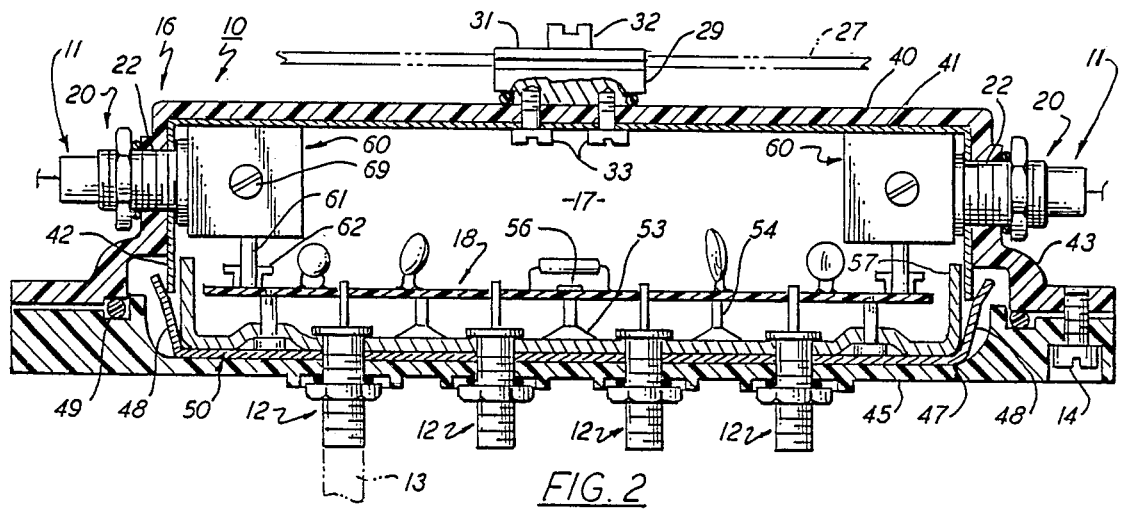
FIG. 2 is an enlarged side elevation in section of the housing shown in FIG. 1 further illustrating the internal construction thereof.

Referring now to the drawings, it is illustrated in FIGS. 1 and 2 a two-piece housing, generally referenced 10 for electrically coupling two ends of a coaxial television distribution cable 11, to one or more tap connectors 12—12 so that communication signals transmitted along the distribution line can be shunted to one or more subscriber locations. A drop line 13 is shown in phantom outline connected to one of the taps 12 in FIG. 2. The protective housing including a base section 15 that is removably attached by screws 14 or the like to a cover section 16 so as to provide an interior chamber 17 which protectively encloses a circuit board 18. The circuit board includes circuit components needed to shunt television communication signals from the main distribution line to the various tap connections so as to properly process the signals.

The connector housing shown in FIG. 1 is adapted for pedestal mounting wherein the main line coaxial cable 11—11 enters and leaves the housing through access ports 19—19 mounted in the front wall 21 of the cover plate section. The access ports are adapted to receive any type of conventional cable connectors 20—20 known and used in the art. The access ports 22—22 formed in the opposing side walls 23 and 24 of the cover section are in this embodiment closed by means of weather type plugs 25—25.

In FIG. 2, the housing is shown adapted for use in an above-ground installation wherein the main coaxial line 11—11 enters and leaves the housing through the sidewall access ports 22—22. In this particular application, the housing is suspended from a support cable 27 by means of a clamping bracket 28. The bracket has a fixture 29 secured to the top wall 30 of the cover section by means of screws 33—33. A movable jaw 31 is held to the fixed jaw by means of a screw 32. In assembly, the support cable is placed in the notch formed between the opposing jaw members ad is clamped in place by tightening down on the screw 32. Although not shown, in the above ground installation the access ports 19—19 formed in the front wall of the cover section are closed by means of plugs similar to those shown in FIG. 1 at 25—25.

In the main embodiment of the invention shown in FIG. 2, the top cover section 16 of the housing includes an outer shell 40 made of high-strength, non-porous plastic material which is molded to the desired cover shape. A top liner 41 made of conductive metal is inserted inside the shell so that the liner complements and fits snugly against the interior wall surfaces of the cover section. The liner is provided with a peripheral skirt 42 that extends downwardly below the recess formed in wall 43 formed in the lower flange of the cover section. In assembly, the top liner is held against the interior walls of the outer shell by means of screws 33—33 which also serve to hold the clamping bracket in place. The coaxial cable connector 20—20 are passed through the shell and the liner and are secured in place so that the liner will become grounded when the cable is mounted in the connectors.

The base section 15 of the housing also includes an outer shell 45 that is molded from a similar high-strength, non-porous plastic as is the outer shell of the cover section. A conductive metal bottom liner 47 is secured to the interior bottom wall of the shell 45, by any suitable means. The bottom liner has raised sidewalls 48—48 about its entire periphery that terminate in an outwardly turned biasing lip. In assembly, the skirt of the top liner is slidably received inside the sidewalls of the lower liner. A slight interference fit is provided between the skirt and the sidewalls 48—48 so that when the cover section is closed against the base section, the outer peripheries of the two liners are biased one against the other to provide excellent electrical contact therebetween. An O-ring 49 is compressed between the cover section and the base section to prevent moisture and the like from entering the interior chamber of the housing.

A conductive metal support bracket 50 is seated inside the lower liner of the housing and secured to the bottom liner by any suitable means such as spot welds or the like. The bracket contains a series of raised dimples 53—53 under which are housed the expanded heads of supports posts 54—54. The support posts are passed upwardly through the bracket and the circuit board 18 is mounted thereon. A small screw 56 is passed through the board and threaded into the raised end of each post to hold the board securely in place. Tap connectors 12—12 are arranged so that they pass upwardly through both the base section and the support bracket. Each connector contains a terminal that is coupled electrically to the circuit board. An O-ring gasket that passes about the body of each connector prevents moisture from passing between the connector and the housing.

The support bracket 50 may be provided with raised side walls 57—57 that cooperated with the raised sidewalls 48—48 of the lower liner to provide a clamp into which the skirt 42 of the top liner is inserted when the housing is closed. At closing, the skirt of the top liner is securely gripped between walls 48 and 57 to provide a continuous electrical seal about the entire periphery of the housing thus eliminating the need for wire mesh gaskets or the like as presently used in most protective housings of this type of device.

Figure 3:
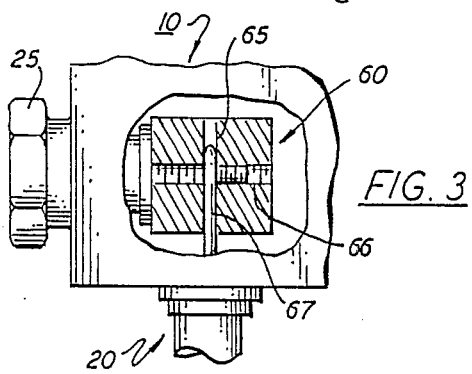
FIG. 3 is a partial top view of the housing shown in FIG. 1 having portions broken away to show a connector block for joining one end of a distribution cable to an electrical device mounted within the housing.

With further reference to FIG. 3, a pair of cube-shaped block connectors 60—60 are mounted upon opposite ends of the circuit board adjacent to the access ports formed in the top cover section of the housing. Each block has a cylindrical terminal 61 that is rotatably supported in a clip-like mounting bracket 62 secured to the circuit board. Each block connector is able to be rotated about the axis of the terminal so that its relative position in reference to the adjacent access ports can be selectively changed. Each block has a pair of intersecting holes 65 and 66 passing centrally therethrough as shown in FIG. 3. Hole 65 is adapted to receive the center conductor 67 of the main distribution cable 11. The second hole 66 is threaded and contains a screw 69. In assembly, the block is turned, depending on whether the housing is being utilized in an above ground installation or a below ground installation, so that the hole 65 faces the active access port in which the distribution cable 11 is connected. The threaded hole 66 formed in the block is arranged to face the plugged access port. With the center connector 67 seated within hole 65, the plug is removed from the unused access port to allow a suitable tool to be passed into hole 66 for turning the set screw. The set screw is tightened against the center conductor of the distribution cable to lock it within the block. When the center connector is securely locked in place, the tool is removed and the access port once again closed using plug 25.

Figure 4:
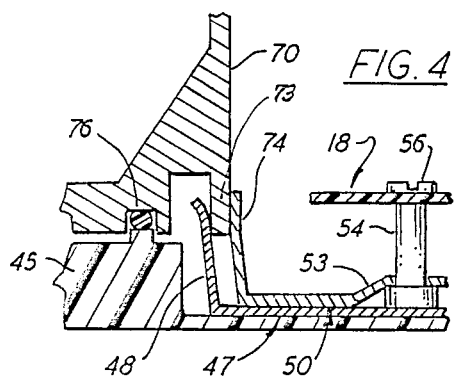
FIG. 4 is an enlarged partial side elevation in section illustrating a second embodiment of the present invention.

Turning now to FIG. 4 there is shown a second embodiment of the present invention wherein the cover section 70 of the housing is cast from a single piece of conductive metal, such as aluminum. As described in greater detail above, in reference to FIG. 2, the base section includes a molded plastic shell 45, an inner metal liner 47 and a support bracket 50 containing upraised posts 54 upon which circuit board 18 is mounted. In this particular embodiment of the invention, the cover section is provided with a downwardly directed interior skirt 73 which extends about the entire inner periphery thereof. Liner 47 contains a raised peripheral wall 48 that is spaced apart from a second raised peripheral wall 74 that is part of the circuit board bracket. The gap between the two raised walls is uniform about the housing and is slightly less than the width of the skirt 73. When the cover section is closed against the base section the skirt is forced between the two raised wall members to provide an extremely good electrical connection between the contacting members. The raised walls thus form a continuous clamp extending around the housing for grasping and holding the skirt of the cover section. Because of the tight positive contact established about the periphery of the liners, the mesh wire gaskets used in the more conventional housing can be eliminated without adversely effecting the system. A sealing gasket 76 is compressed between the base and cover sections as shown to prevent moisture and other contaminants from entering the housing.

Figure 5:
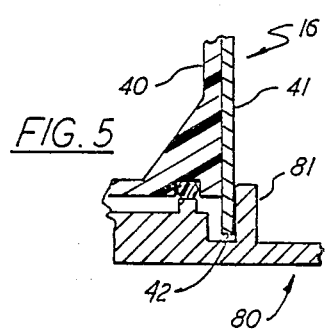
FIG. 5 is also an enlarged partial side elevation in section showing a third embodiment of the present invention.

In another embodiment of the invention shown in FIG. 5 the base section is cast from a single piece of conductive metal such as aluminum or the like. The cover section includes a plastic outer shell 40 and an inner liner 41 as disclosed in detail above in reference to the embodiment shown in FIG. 2. The base section contains a raised leg 81 that is positioned so that it is urged into biasing contact against the skirts 42 of the liner 41. Here again, when the cover section is secured to the base section, good electrical contact is established between the liner and the metal base section.

Figure 6:
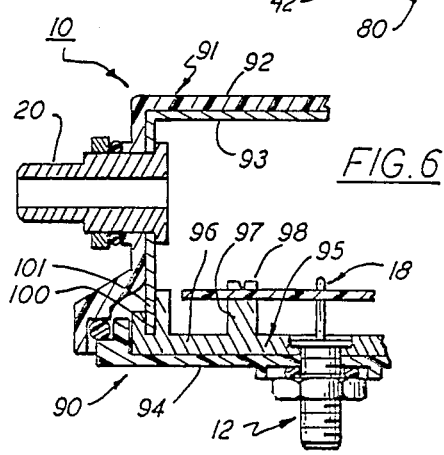
FIG. 6 is another partial side elevation in section showing a still further embodiment of the present invention.

Referring now to FIG. 6 there is shown another form of the invention. Here the cover section 91 of the housing includes an outer plastic shell 92 having high strength and being impervious to outside elements. The cover section further includes an internal conductive metal liner 93 that is arranged to fit snugly against the interior surfaces of the shell. Connectors 20 of any suitable design are adapted to bring the center connector of a coaxial cable into the housing as explained above. Although not shown, the center connector is coupled to the circuit board 18 enclosed within the housing by means of a block connector.

The base section 90 of the housing contains a non-porous outer shell 94 and a combination liner and bracket member 95. Member 95 is preferably die cast of a single piece of conductive metal such as aluminum. The member includes a bottom wall 96 that seats snugly in the shell 94 and a series of upraised posts 97. The board 18 is arranged to seat on the posts and is held in place by screws 98. A channel 100 surrounds the periphery of member 95 and is adapted to slidably receive therein the terminal end 101 of the liner 93 so that good electrical contact is maintained therebetween.

Tap connectors 12, as note above, are passed upwardly through the floor of the base section and make electrical contact with the circuitry on the board.

As can be seen from the description above, either one or both of the housing sections can be molded from a high strength plastic that is impervious to outdoor weather. This considerably reduces the cost of the housing without sacrificing either electrical or physical properties. A thin metal liner which can be easily stamped from sheet material or formed using die casting techniques is snugly fitted into the plastic section thereby providing an effective electrical shield for the device enclosed within the housing. The plastic shell and metal insert can be easily machined as a unit to receive connectors or the like whereby the electrical device contained within the housing can be coupled to exterior electrical lines such as television distribution cables and/or drop lines.

While this invention has been explained with reference to the structure disclosed herein, it is not confined to the details set forth and this application is intended to cover any modifications and changes as may come within the scope of the following claims.

What is claimed is:

1. An apparatus for protectively enclosing an electrical device comprising;

a housing having a base section and a removable cover section that closes upon the base section to form an interior chamber therebetween said sections being molded of a high strength non-porous plastic;

a top metal liner covering the interior walls of the cover section;

a bottom metal liner covering the interior walls of the base section;

a peripheral skirt portion extending from one of said liners disposed to pass inside the sidewalls of the other liner, said other sidewalls having an outwardly turned lip which seats in biasing contract against said skirt portion when the cover and base sections are closed against each other;

bracket means for supporting an electrical device when mounted in said other liner having a raised peripheral wall that is parallel with the sidewall of said other liner to provide a gripping means for the said extending peripheral skirt portion securely therebetween whereby an electrical device when mounted in said housing is electrically shielded by the liners and physically protected from the surrounding ambient by said cover and base sections.

2. Apparatus for protectively enclosing an electrical device comprising a housing having a base section and a cover section that combine to form an interior chamber, a bracket means connected to one of said sections for supporting an electrical device when mounted inside said chamber, said base section being cast of a conductive metal and said cover section being molded of a high-strength non-porous plastic, a conductive metal liner covering the interior walls of the molded cover section, and contact means for placing the liner in electrical contact against the base section to provide an electrical seal therebetween whereby an electrical device when mounted in said interior chamber is both electrically shielded from radio frequency interference and physically protected from the surrounding ambient.

3. The apparatus of claim 2 wherein said base section has at least one interior wall that is slidably received inside the sidewalls of said liner and said sidewalls having an outwardly turned lip that seats in biasing contact against said at least one interior wall to electrically connect the liner and the base section.

4. The apparatus of claim 2 that further includes fastening means for removably securing the cover section to the base section and gasket means for forming a seal between the cover section and the base section.

5. The apparatus of claim 2 that further includes connecting means mounted in the housing for electrically coupling the electrical device to exterior cable transmission means for introducing communication signals thereto.

6. Apparatus for protectively enclosing an electric device including a housing having a base section and a removable cover section that combine to form an interior chamber, said cover section being cast of a conductive metal and said base section being molded of a high-strength non-porous plastic, a conductive metal liner mounted in said base section having raised side walls, a bracket means mounted inside the liner having means for supporting an electrical device when mounted inside said chamber, said sidewalls of the liner having an outwardly turned lip that is biased into contact with at least one interior wall that extends from the cover section.

7. The apparatus of claim 6 wherein the bracket means has raised sidewalls that are uniformly spaced from the raised sidewalls of the liner to provide a gap therebetween for gripping the said at least one interior wall of the cover section therebetween to provide an electrical seal about the housing.

8. The apparatus of claim 7 that further includes post means secured to the bracket means, and wherein said electrical device is a circuit board mounted upon said post means.

9. The apparatus of claim 8 that further includes fastener means for removably securing the cover section to the base section and gasket means for providing a weathertight seal between the sections.

10. The apparatus of claim 9 that further includes connecting means attached to said housing for connecting the circuit board to exterior electrical lines.

* * * * *